United States Patent
Ojha et al.

(10) Patent No.: US 11,923,799 B2
(45) Date of Patent: Mar. 5, 2024

(54) SYSTEMS AND METHODS FOR REGULATING SLEW TIME OF OUTPUT VOLTAGE OF DC MOTOR DRIVERS

(71) Applicant: Texas Instruments Incorporated, Dallas, TX (US)

(72) Inventors: Ashish Ojha, Bangalore (IN); Krishnamurthy Shankar, Bangalore (IN); Siddhartha Gopal Krishna, Bengaluru (IN); Priyank Anand, Bangalore (IN); Ganapathi Hegde, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 17/397,156

(22) Filed: Aug. 9, 2021

(65) Prior Publication Data

US 2023/0044791 A1 Feb. 9, 2023

(51) Int. Cl.
*H02P 7/29* (2016.01)
*H02H 9/00* (2006.01)
*H03K 17/16* (2006.01)

(52) U.S. Cl.
CPC ............. *H02P 7/29* (2013.01); *H02H 9/001* (2013.01); *H03K 17/165* (2013.01)

(58) Field of Classification Search
CPC ........ H03F 2203/45248; H02M 1/0029; H02P 7/29; H02H 9/001; H03K 17/165
USPC ........................................ 318/400.26, 400.19
See application file for complete search history.

(56) References Cited

U.S. PATENT DOCUMENTS

| 11,152,857 | B2* | 10/2021 | Han | H03K 17/0822 |
| 11,552,633 | B1* | 1/2023 | Cignoli | H03K 17/223 |
| 2004/0140833 | A1* | 7/2004 | Kim | H03K 17/166 327/170 |
| 2007/0040536 | A1* | 2/2007 | Smith | H02M 3/1588 323/280 |
| 2008/0232144 | A1* | 9/2008 | Klein | H02M 1/36 363/49 |
| 2012/0027447 | A1* | 2/2012 | Mukaibara | G03G 15/1645 363/21.01 |
| 2012/0229113 | A1* | 9/2012 | Houston | H02M 3/1588 323/288 |
| 2017/0201086 | A1* | 7/2017 | Chen | H02H 9/025 |
| 2020/0153429 | A1* | 5/2020 | Butenhoff | H03K 17/166 |
| 2022/0231592 | A1* | 7/2022 | Lin | H03K 17/165 |
| 2022/0350354 | A1* | 11/2022 | D'Souza | H04B 1/40 |

* cited by examiner

*Primary Examiner* — Jorge L Carrasquillo
(74) *Attorney, Agent, or Firm* — John R. Pessetto; Frank D. Cimino

(57) ABSTRACT

An apparatus for regulating a slew time of an output voltage of a motor driver system includes a gate current control circuit which has a first input coupled to receive a target slew time and a second input coupled to receive a slew time. The gate current control circuit provides an incremented gate current if the slew time is greater than the target slew time and provides a decremented gate current if the slew time is less than the target slew time. The apparatus includes a gate driver which has a first input coupled to receive a PWM signal and a second input coupled to receive the gate current. The gate driver provides a gate drive signal.

17 Claims, 5 Drawing Sheets

SYSTEMS AND METHODS FOR REGULATING SLEW TIME OF OUTPUT VOLTAGE OF DC MOTOR DRIVERS

TECHNICAL FIELD

This description relates generally to DC motor drivers.

BACKGROUND

DC motors are found in automobiles, industrial fans and pumps, machine tools, household appliances, drones, gimbles, and disk drives. A DC motor is generally run by a driver circuit which may include a number of field effect transistors (FETs) arranged in a bridge configuration. The driver circuit controls motor speed and torque by providing a pulsed direct current of varying pulse length and frequency to the motor.

In many applications, the DC motor can be located at a distance (e.g., >5 m) from the driver circuit, thus requiring long cables to electrically connect the motor to the driver circuit. As the FETs are switched at a high frequency to provide the pulsed current to the motor, the output voltage slews at a high rate during each switching pulse. Because of the long cables and the high slew rate of the output voltage, electromagnetic interference (EMI) can occur.

SUMMARY

In one aspect, an apparatus for regulating a slew time of an output voltage of a motor driver system includes a comparison circuit which has a first input coupled to the output voltage, a second input coupled to an upper reference voltage, and a third input coupled to a lower reference voltage. The comparison circuit provides a start signal if the output voltage falls below the upper reference voltage and provides an end signal if the output voltage falls below the lower reference voltage. The apparatus includes a slew time detection circuit which has a first input coupled to receive a pulse width modulated (PWM) signal and a second input coupled to receive the start/end signal. The slew time detection circuit provides a slew time signal indicating the duration between assertion of the start signal and assertion of the end signal. The apparatus includes a gate current control circuit which has a first input coupled to receive a target slew time and a second input coupled to receive the slew time signal. The gate current control circuit provides an incremented gate current if the slew time is greater than the target slew time and provides a decremented gate current level if the slew time is less than the target slew time. The apparatus includes a gate driver which has a first input coupled to receive the PWM signal and a second input coupled to receive the gate current. The gate driver provides a gate drive signal.

In an additional aspect, the apparatus includes a transistor control circuit coupled to receive the PWM signal. The transistor control circuit provides a high-side PWM signal or a low-side PWM signal.

In an additional aspect, the gate current control circuit provides the incremented gate current if a transistor is in the Miller region and provides the decremented gate current if the transistor is in the Miller region.

In an additional aspect, the comparison circuit includes a first comparator which has a non-inverting input coupled to the upper reference voltage and an inverting input be coupled to the output voltage. The first comparator provides the start signal if the output voltage falls below the upper reference voltage. The comparison circuit includes a second comparator which has a non-inverting input coupled to the output voltage and an inverting input coupled to the lower reference voltage. The second comparator provides the end signal if the output voltage falls below the lower reference voltage.

In an additional aspect, a motor driver system includes a system input coupled to an input voltage and a system output coupled to a motor to supply an output voltage to the motor. The system includes a high-side transistor which has a first terminal coupled to the system input, a second terminal coupled to the system output, and has a control terminal. The system includes a comparison circuit which has a first input coupled to the system output, a second input coupled to an upper reference voltage, and a third input coupled to a lower reference voltage. The comparison circuit provides a start signal if the transistor transitions to a Miller region and provides an end signal if the transistor exits the Miller region. The system includes a slew time detection circuit which has a first input coupled to receive a pulse width modulated (PWM) signal and a second input coupled to receive the start/end signal. The slew time detection circuit provides a slew time signal indicating the duration between assertion of the start signal and assertion of the end signal. The system includes a gate current control circuit which has a first input coupled to receive a target slew time and a second input coupled to receive the slew time signal. The gate current control circuit provides an increased gate current if the slew time is greater than the target slew time and provides a decreased gate current if the slew time is less than the target slew time. The system includes a gate driver which has a first input coupled to receive a high-side PWM signal and a second input coupled to receive the gate current. The gate driver provides a high-side gate drive signal to the transistor.

In an additional aspect, a motor driver system includes a system input coupled to an input voltage and a system output coupled to a motor to supply an output voltage to the motor. The system includes a low-side transistor which has a first terminal coupled to the system output, a second terminal coupled to a ground terminal, and has a control terminal. The system includes a comparison circuit which has a first input coupled to the system output, a second input coupled to an upper reference voltage, and a third input coupled to a lower reference voltage. The comparison circuit provides a start signal if the transistor transitions to a Miller region and provides an end signal if the transistor exits the Miller region. The system includes a slew time detection circuit which has a first input coupled to receive a pulse width modulated (PWM) signal and a second input coupled to receive the start/end signal. The slew time detection circuit provides a slew time signal indicating the duration between assertion of the start signal and assertion of the end signal. The system includes a gate current control circuit which has a first input coupled to receive a target slew time and a second input coupled to receive the slew time signal. The gate current control circuit provides an incremented gate current if the slew time is greater than the target slew time and provides a decremented gate current if the slew time is less than the target slew time. The system includes a gate driver which has a first input coupled to receive a a low-side PWM signal and a second input coupled to receive the gate current. The gate driver provides a low-side gate drive signal to the transistor.

In an additional aspect, a method of regulating a slew time of an output voltage of a motor driver system includes receiving a target slew time, and comparing the output voltage with an upper reference voltage and a lower reference voltage. The method includes providing a start signal and an end signal based on the comparison. The start signal indicates when a transistor transitions to a linear region and the end signal indicates when the transistor exits the linear region. The method includes determining a slew time based on the duration between assertion of the start signal and assertion of the end signal. The method includes incrementing the gate current if the slew time is greater than the target slew time and decrementing the gate current if the slew time is less than the target slew time.

BRIEF DESCRIPTION OF THE DRAWINGS

The same reference numerals or other feature designation are used in the figures for the same or similar features.

DETAILED DESCRIPTION

In some example embodiments, a control circuit regulates a slew time of an output voltage of a motor driver system. By regulating the slew-rate of the output voltage, the control circuit reduces electromagnetic interference (EMI) caused by the switching of field effect transistors (FETs), thereby improving electromagnetic compatibility (EMC) of motor driver systems.

In an example embodiment, the FETs are n-channel field effect transistors (NFETs), and in another example embodiment, the FETs are p-channel field effect transistors (PFETs). In some example embodiments, the transistors may be bipolar transistors and/or other types of power transistors (e.g., drain extended FETs). In some example embodiments, the FETs are implemented in/over a silicon substrate. In other example embodiments, the FETs are implemented using gallium nitride (GaN) and/or silicon carbide (SiC).

Figure 1:
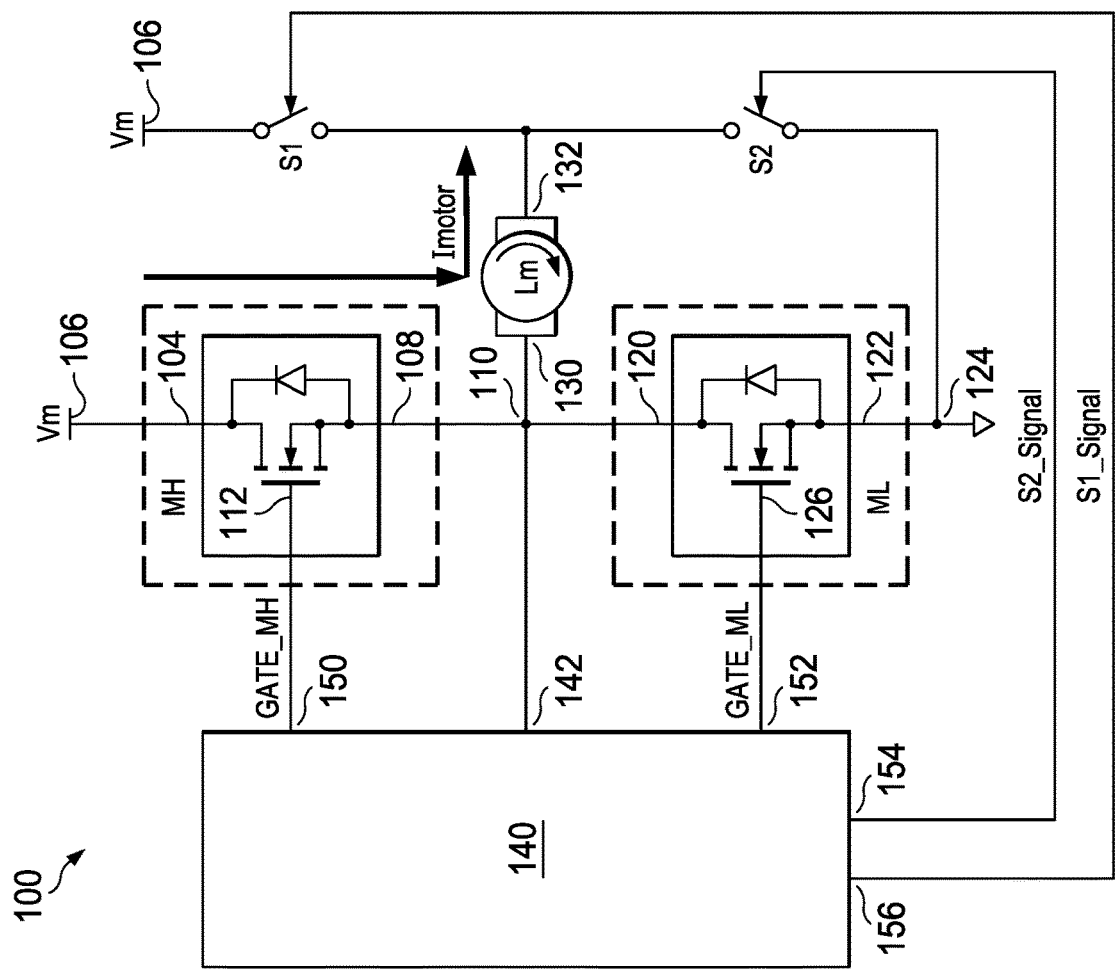
FIG. 1 is a block diagram of a driver system of an example embodiment.

FIG. 1 is a block diagram of a driver system 100 of an example embodiment. The system 100 includes a high-side FET MH which has a first terminal 104 (e.g., drain) coupled to an input voltage terminal 106. The high-side FET MH has a second terminal 108 (e.g., source) coupled to an output 110. The high-side FET MH has a control terminal 112 (e.g., gate). The high-side FET MH includes a body diode with the anode coupled to the source 108 and the cathode coupled to the drain 104.

The system 100 includes a low-side FET ML which has a first terminal 120 (e.g., drain) coupled to the output 110. The low-side FET ML has a second terminal 122 (e,g, source) coupled to a common potential terminal 124 (e.g., ground). The low-side FET ML has a control terminal 126 (e.g., gate). The low-side FET ML includes a body diode with the anode coupled to the source 122 and the cathode coupled to the drain 120.

The input voltage terminal 106 can be coupled to an input voltage Vm (e.g., 12V, 25V, 40V) and the ground terminal 124 can be coupled to a ground level voltage.

A DC motor represented by an inductive load Lm has a first terminal 130 coupled to the output 110. The motor Lm has a second terminal 132 which can be coupled to the input voltage terminal 106 via a first switch S1 or can be coupled to the ground terminal 124 via a second switch S2. To drive the motor Lm is one direction (e.g., clockwise direction), a gate signal GATE_MH is applied to the gate 112 of the high-side FET MH, the switch S2 is turned on (i.e., closed), and the switch S1 is turned off (i.e., opened). As a result, current from Vm flows through the high-side FET MH, through the motor Lm, and then through the switch S2 to ground. To drive the motor Lm in the reverse direction (e.g., counter-clockwise direction), a gate signal GATE_ML is applied to the gate 126 of the low-side FET ML, the switch S1 is turned on (i.e., closed), and the switch S2 is turned off (i.e., opened). As a result, current flows from Vm through the switch S1, through the motor Lm, and then through the low-side FET ML to ground. In an example embodiment, the gate signals GATE_MH and GATE_ML are pulse width modulated (PWM) signals which have a varying frequency but a fixed amplitude.

The system 100 includes a control circuit 140 which has an input 142 coupled to the output voltage Vout (i.e., terminal 110). The control circuit 140 has an output 150 configured to provide the gate signal Gate_MH to the gate 112 of MH and an output 154 configured to provide a switch control signal S2 Signal to the switch S2. The control circuit 140 has an output 152 configured to provide the gate signal Gate_ML to the gate 126 of ML and has an output 156 configured to provide a switch control signal S1 Signal to the switch S1.

In an example embodiment, the control circuit 140 compares Vout to an upper reference voltage Vref_H and a lower reference voltage Vref_L, to determine whether: (1) the FET (e.g., ML) has not yet transitioned to the Miller region; (2) the FET has transitioned to the Miller region; or (3) the FET has exited the Miller region. In the Miller region (also referred to as the linear region), the gate to source voltage (Vgs) of the FET is relatively flat (sometimes referred to as the Miller Plateau). The aforementioned determination by the control circuit 140 is discussed below in more detail.

The control circuit 140 determines the duration in the Miller region in which Vgs of the FET is relatively flat but the output voltage slews because the FET begins to conduct. The duration in the Miller region is referred to as the measured slew time. The control circuit 140 compares the measured slew time with a target slew time. If the measured slew time is greater than the target slew time, the control circuit 140 determines that the slew time needs to be decreased. Accordingly, the control circuit 140 increases the gate signal (e.g., the magnitude of current and/or voltage) supplied to the FET. Conversely, if the measured slew time is less than the target slew time, the control circuit 140 determines that the slew time needs to be increased. Accordingly, the control circuit 140 decreases the gate signal (e.g., the magnitude of current and/or voltage) supplied to the FET. The steps of increasing or decreasing the gate current are repeated in each PWM cycle until the measured slew time is approximately equal to the target slew time at which stage the controller 140 acquires a loop lock and continues to regulate the slew time by varying the gate current supplied to the FET.

In an example embodiment, the control circuit 140 regulates the output voltage slew rate dV/dt by regulating the slew time. The output voltage slew rate is represented by the equation:

$$dV/dt = I_{drive}/C_{GD} \qquad (1)$$

where $I_{drive}$ is the gate current supplied to the FET and $C_{GD}$ is the parasitic capacitance between the gate and the drain of the FET. Thus, for a given or fixed "dV", the control circuit 140 regulates the slew rate dV/dt by varying $I_{drive}$.

In alternative example embodiments, voltage and/or current sensors may be utilized to sense Vout, the current flowing through the motor (Imotor) and/or the voltage across and/or the current through the transistors.

Figure 2:
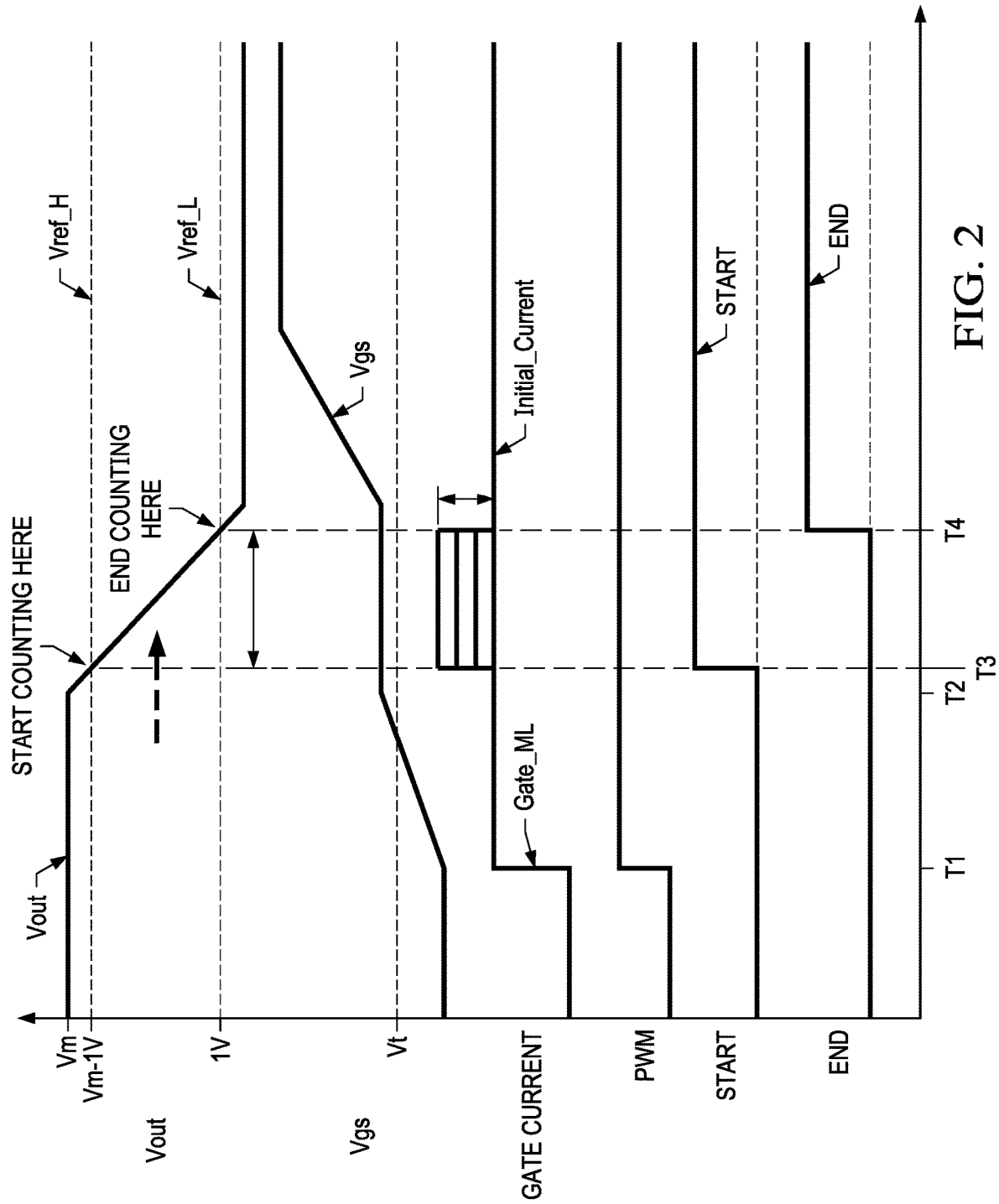
FIGS. 2-3 are timing diagrams illustrating waveforms demonstrating slew time regulation.

FIG. 2 are waveforms illustrating the regulation of the slew time when the motor Lm is driven in one direction by applying the gate signal GATE_ML to the low-side FET ML. In the example of FIG. 2, the control circuit 140 measures Vout to identify whether: (1) the FET ML has not yet transitioned to the Miller region; (2) the FET ML has transitioned to the Miller region; or (3) the FET ML has exited the Miller region. In FIG. 2, the x-axis represents time, and the y-axis represents current with respect to gate current ("GATE CURRENT") and represents voltage with respect to Vout, Vgs, PWM, START and END signals.

Initially, the following parameters are utilized: (1) a target slew time Target_Slew; and (2) an initial drive current Initial_Current. The target slew time Target_Slew can be user defined based on, for example, system requirements. The initial drive current Initial_Current is defined as the current supplied to the gate of ML on the first occurrence of the PWM signal. The initial drive current can be user defined, system defined or determined during system operation. Transistors MH and ML are not turned on (e.g. are not conducting) at the same time to prevent a short circuit from Vm to ground.

At time T1, a PWM signal is received by control circuit 140 via an input (not shown in FIG. 1) coupled to a processor, digital logic circuitry and/or analog circuitry. In FIG. 2, only a section of a pulse of the PWM signal is shown. In response to the PWM signal, the control circuit 140 applies a gate signal Gate_ML to the gate 126 of the low-side FET ML. (In FIG. 2 the gate signal Gate_ML is not shown but the magnitude of its current is shown by the graph "GATE CURRENT.") At time T1, because the FET ML has not conducted yet, the output voltage Vout is approximately Vm because Vm appears through the body diode of MH. The control circuit 140 supplies the initial drive current Initial_Current at time T1, and as a result the gate to source voltage Vgs of ML begins to rise. At time T2, when Vgs exceeds a threshold voltage Vt, the FET ML begins to transition to the Miller region and the output voltage Vout begins to slew downward. At time T3, when the output voltage Vout falls below an upper reference voltage Vref_H, the control circuit 140 generates a start signal START which indicates the FET has transitioned to the Miller region. In an example embodiment, the upper reference voltage Vref_H is set at Vm-1V. The output voltage Vout continues to slew downward and at time T4, when the output voltage Vout falls below a lower reference voltage Vref_L, the control circuit 140 generates the end signal END which indicates the FET ML has exited the Miller region. In an example embodiment, VREF_L is set at 1V.

The control circuit 140 determines the duration of the Miller region based on the time period between the rising edge of the start signal START and the rising edge of the end signal END. The duration of the Miller region is the measured slew time (which in some embodiments is T4-T3). In the Miller region, the magnitude of the current can be increased or decreased. As explained below, if the current is increased, the slew time is decreased (not shown in FIG. 2), and if the current is decreased, the slew time is increased (not shown in FIG. 2).

The control circuit 140 compares the measured slew time with the target slew time Target_Slew. If the measured slew time is greater than the target slew time, upon occurrence of the next start signal (not shown in FIG. 2), the control circuit 140 increases the gate current supplied to the FET ML, which has the effect of reducing the measured slew time. As a result, the output voltage slew rate is increased. If the measured slew time is less than the target slew time, upon occurrence of the next start signal (not shown in FIG. 2), the control circuit decreases a gate current supplied to the FET ML, which has the effect of increasing the measured slew time. As a result, the output voltage slew rate is decreased.

The steps of increasing or decreasing the gate current supplied to the FET ML are repeated upon each occurrence of the start signal until the measured slew time is approximately equal to the target slew time at which stage the controller 140 acquires a loop lock and continues to regulate the slew time by varying the gate current in each cycle between START and END. Since the slew rate dV/dt is determined by the ratio of the gate current and $C_{gd}$, by varying the gate current, a desired slew rate dV/dt is achieved.

In other example embodiments, the same process as described with reference to FIG. 2 is utilized for the operation of the motor in the opposite direction. For this operation, where transistor MH is operating and ML remains off, similar signals (as depicted in FIG. 2) are utilized for the operation of MH as was used for the operation of ML in FIG. 2.

Figure 3:
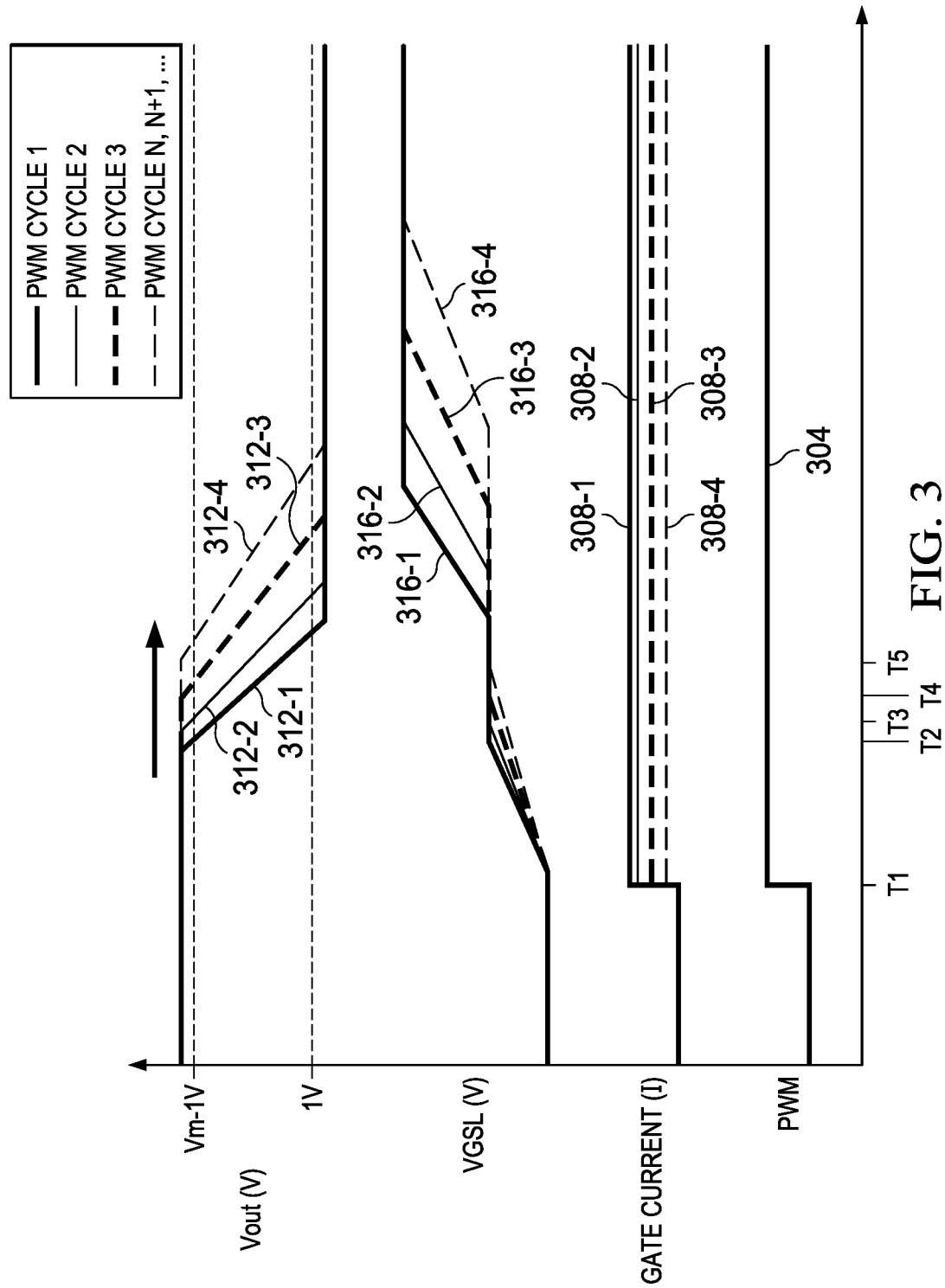

FIG. 3 are waveforms illustrating the steps of increasing the slew time in each cycle to achieve the target slew time with respect to transistor ML (transistor MH is off during this period)(a similar process with similar signals can be utilized for transistor MH, with transistor ML turned off). At time T1, a PWM signal 304 is received by control circuit 140 (e.g. from a processor, digital logic circuitry and/or analog circuitry), and, in response, the control circuit 140 applies a gate signal Gate_ML having a current magnitude 308-1 (solid dark line) to the gate 126 of the FET ML. (In FIG. 3, the gate signal Gate_ML is not shown but the magnitude of its current is shown by the graph "GATE CURRENT.") Since the FET ML is not turned on at time T1, the output voltage Vout is approximately Vm.

In response to the gate signal having a current magnitude 308-1, the gate to source voltage Vgs 316-1 (solid dark line) rises and the output voltage 312-1 (solid dark line) slews down. The control circuit 140 measures the slew time corresponding to the output voltage 312-1. In this example, because the slew time is less than the target slew time, the control circuit 140 reduces the gate current to the level 308-2 (solid light line). In response, the gate to source voltage Vgs 316-2 rises and the output voltage 312-2 (solid light line) changes less rapidly. The control circuit 140 measures the slew time corresponding to the output voltage 312-2. Because the slew time time is still less than the target slew time, the control circuit 140 again reduces the gate current to a level 308-3 (dashed dark line) and measures the slew rate for the corresponding output voltage 312-3 (dashed dark line). Because the slew time is still less than the target slew time, the control circuit 140 yet again reduces the current level 308-4 (dashed light line) and measures the slew rate for the corresponding output voltage 312-4 (dashed light line). Because the slew time is approximately equal to the target slew time responsive to the current 308-4, the control circuit 140 acquires a loop lock and regulates the slew time in subsequent cycles.

Figure 4:
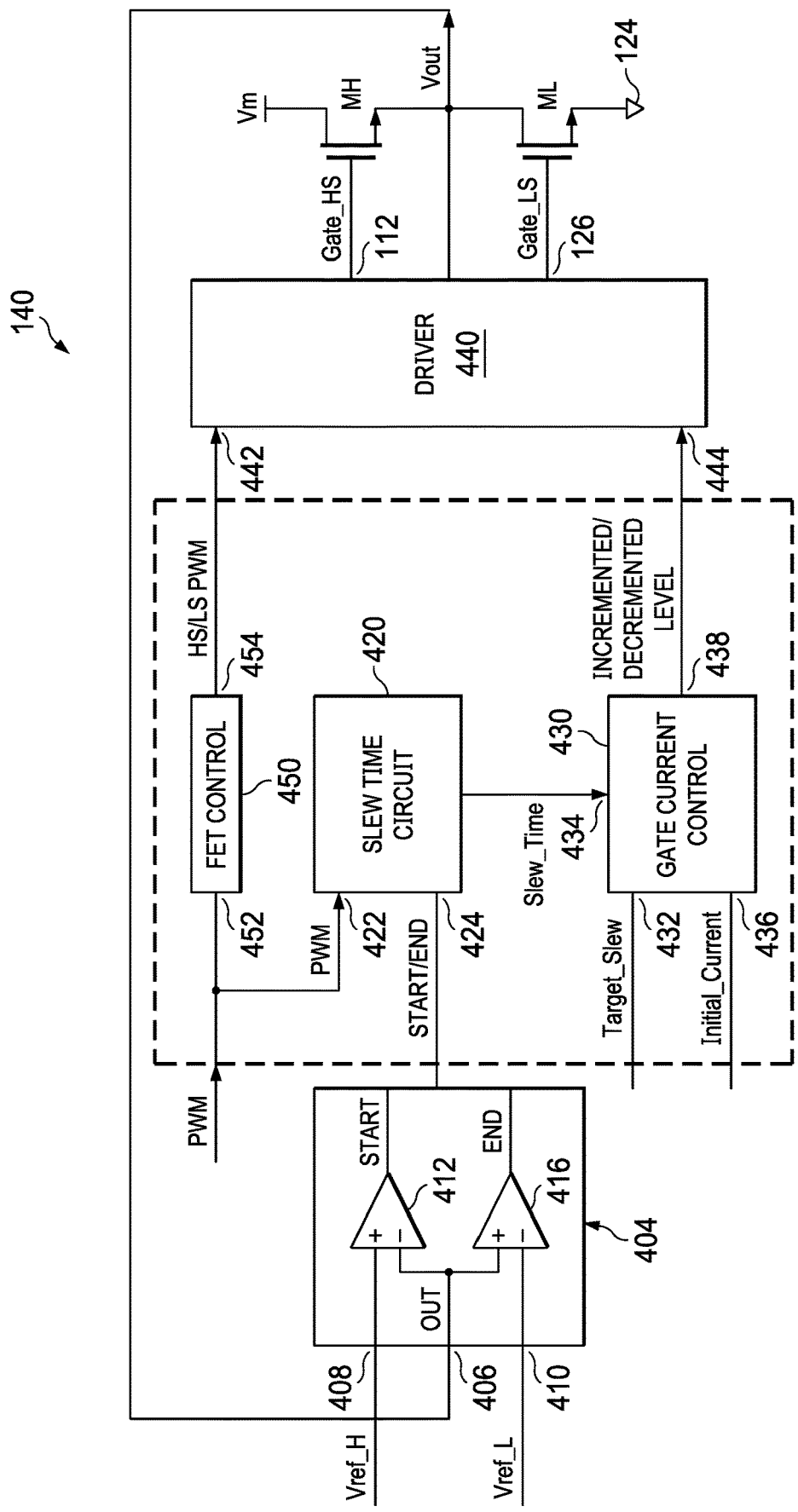
FIG. 4 is a block diagram of the control circuit of an example embodiment.

FIG. 4 illustrates a block diagram of the control circuit 140 of an example embodiment. The control circuit 140 includes a comparison circuit 404, a FET control circuit 450, a slew time circuit 420, a gate current control circuit 430 and a driver 440. The comparison circuit 404 has a first input 406 coupled to receive the output voltage Vout, a second input 408 coupled to receive the upper reference voltage Vref_H, and a third input 410 coupled to receive the lower reference voltage Vref_L. The comparison circuit 404 compares Vout to Vref_H and Vref_L, and based on the comparison determines whether the applicable transistor (e.g. transistor ML or MH) has: (1) transitioned to the Miller region; or (2) exited the Miller region and has transitioned to the FET enhancement region. The comparison circuit 404 provides a start signal START if the FET ML has transitioned to the Miller region and provides an end signal END if the FET ML has exited the Miller region.

In an example embodiment, the comparison circuit 404 is implemented with first and second comparators 412 and 416. The first comparator 412 has a non-inverting input coupled to receive Vref_H and an inverting input coupled to receive Vout. The output of first comparator 412 may be connected to a slew time circuit 420 via input 424 to provide the start signal START if Vout<Vref_H. The second comparator 416 has an inverting input coupled to receive the Vref_L and a non-inverting input coupled to receive Vout. The output of second comparator 416 may be connected to a slew time detection circuit 420 via input 424 to provide the end signal END if Vout<Vref_L.

The control circuit 140 includes the slew time detection circuit 420 which has a first input 422 coupled to receive a pulse width modulated (PWM) signal and a second input 424 coupled to receive the START/END signal from the comparison circuit 404. The slew time detection circuit 420 provides a slew time signal Slew_Time which indicates the duration between the occurrence of START and END signals.

In an example embodiment, the circuit 420 is implemented with a phase detector and a counter which measure the delay between a rising edge of the PWM signal and a rising edge of the START/END signal and provides the slew time signal Slew_Time. The PWM signal may be generated by, for example, a comparator which compares a reference voltage to a triangle wave or may be generated by a microprocessor, ASIC, or software.

The control circuit 140 includes a gate current control circuit 430 which has a first input 432 coupled to receive a target slew time Target_Slew, a second input 434 coupled to receive the slew time signal Slew_Time from slew time detection circuit 420, and a third input 436 coupled to receive an initial gate current level Initial_Current.

If the slew time Slew_Time is greater than the target slew time Target_Slew, upon occurrence of the next start signal, the gate current control circuit 430 increases the gate current level and provides an increased gate current at an output 438, which has the effect of increasing the gate current supplied to the transistor MH or ML (in a different PWM cycle, for example, the gate current may be adjusted for the other transistor ML or MH). If the slew time Slew_Time is less than the target slew time Target_Slew, upon occurrence of the next start signal, the gate current control circuit 430 decreases the gate current level and provides a decreased gate current at the output 438, which has the effect of decreasing the gate current supplied to the transistor MH or ML.

The control circuit 140 includes a gate driver 440 which has a first input 442 coupled to receive either a high-side PWM signal HS_PWM or a low-side PWM signal LS_PWM and a second input 444 coupled to receive the incremented/decremented gate current level that corresponds to transistor MH or ML for a particular PWM cycle. Responsive to the high-side PWM signal, the gate driver 440 applies a high-side gate drive signal Gate_HS to the gate 112 of the high-side FET MH, and responsive to the low-side PWM signal, the gate driver applies a low side gate signal Gate_LS to the gate 126 of the low-side FET ML.

In an example embodiment, the control circuit 140 includes a FET control circuit 450 which has an input 452 coupled the PWM signal. The FET control circuit 450 provides either the high-side PWM signal HS_PWM or the low-side PWM signal LS_PWM at an output 454. In response to the high-side PWM signal, the gate driver 440 applies the high-side gate drive signal to MH, and in response to the low-side PWM signal, the gate driver applies the low side gate drive signal to ML. As discussed before, when LS_PWM is applied, the motor Lm is driven in one direction, and when HS_PWM, the motor is driven in the reverse direction. In some example embodiments, when HS_PWM (and gate signal Gate_MH) is high (or in a state to cause MH to conduct), LS_PWM (and gate signal Gate_ML) is low (or in a state to cause ML not to conduct); and when LS_PWM is high (or in a state to cause ML to conduct), HS_PWM is low (or in a state to cause MH not to conduct).

Figure 5:
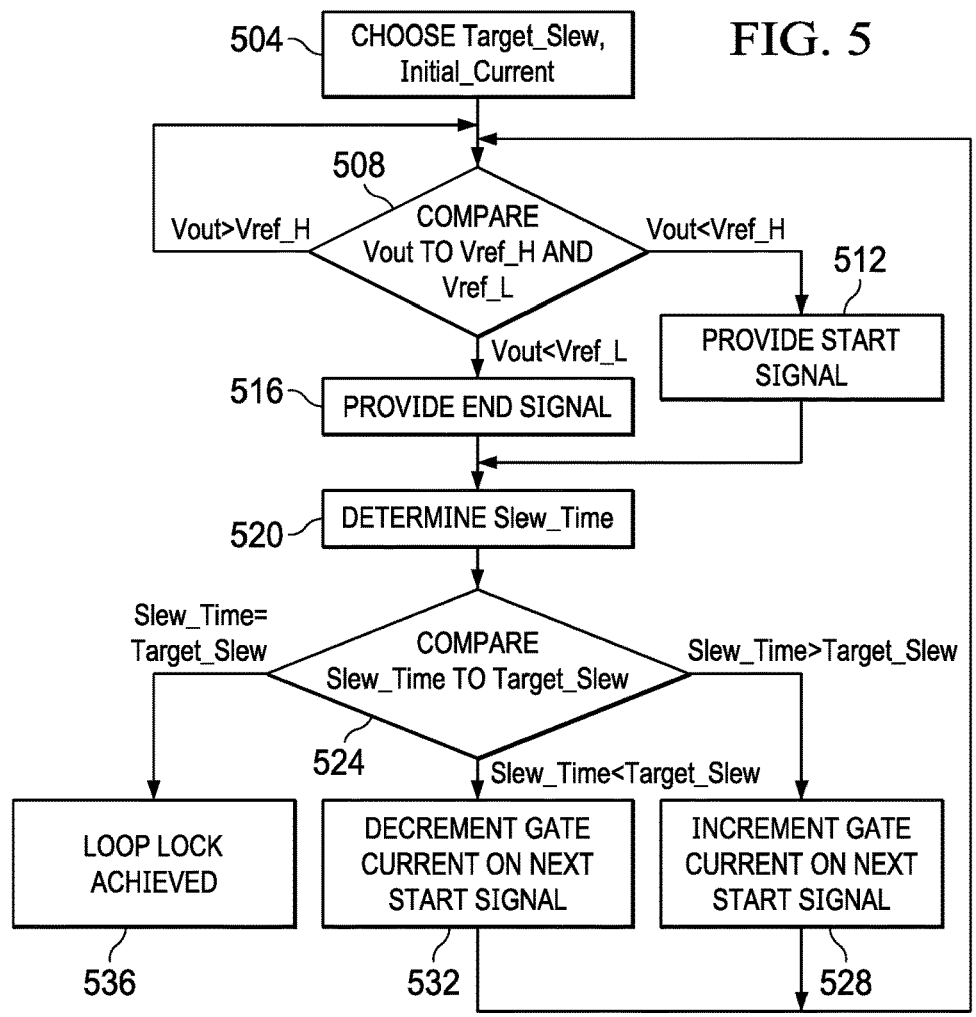
FIG. 5 is a flow diagram of a method of an example embodiment.

FIG. 5 is a flow diagram of a method of an example embodiment. The method regulates a slew time of a FET (e.g., low-side FET). The slew time of the high-side FET can be regulated similarly.

In block 504, a target slew time Target_Slew and an initial gate current Initial-Current are chosen. The target slew time Target_Slew can be chosen based on, for example, system requirements or based on user inputs. The initial gate current Initial_Current is defined as the current supplied by the control circuit to the FET on the first occurrence of the PWM signal.

In block 508, an output voltage is compared with an upper reference voltage and a lower reference voltage. In an example embodiment, the upper reference voltage Vref_H is set at Vm-1V and the lower reference voltage VREF_L is set at 1V. If the output voltage Vout is below the upper reference voltage, in block 512 the control circuit 140 provides the start signal START which indicates that the FET ML has transitioned to the Miller region. If the output voltage Vout is below the lower reference voltage, in block 516 the control circuit provides the end signal END which indicates that the FET ML has exited the Miller region. If the output voltage Vout is above the upper reference voltage Vref_H, the process returns to block 508 where Vout is compared again to Vref_H and Vref_L. As discussed before, if Vout is below the upper reference voltage Vref_H, the flow proceeds to block 512, and if Vout is below the lower reference voltage Vref_L, the flow proceeds to block 516.

In block 520, the control circuit determines a slew time Slew_Time (referred to as the measured slew time) based on the duration between the rising edge of the start signal START and the rising edge of the end signal END.

In block 524, the control circuit 140 compares the measured slew time Slew_Time to the target slew time Target_Slew. If the measured slew time Slew_Time is greater than the target slew time Target_Slew, in block 528 the control circuit 140 increments the gate current level on occurrence of the next start signal START and supplies the incremented current to the FET, which has the effect of reducing the slew time, and thereafter the process returns to block 508.

If the measured slew time is less than the target slew time, in block 532 the control circuit 140 decrements the gate current level and supplies the decremented current to the FET, which has the effect of increasing the slew time, and thereafter the process returns to block 508.

The steps of increasing or decreasing the current are repeated upon each occurrence of the start signal START until in block 524 the measured slew time Slew_Time is approximately equal to the target slew time Target_Slew at which stage the control circuit 140 acquires a loop lock. In subsequent cycles, the process continues to compare the measured slew time to the target slew time and regulates the slew time.

Figure 6:
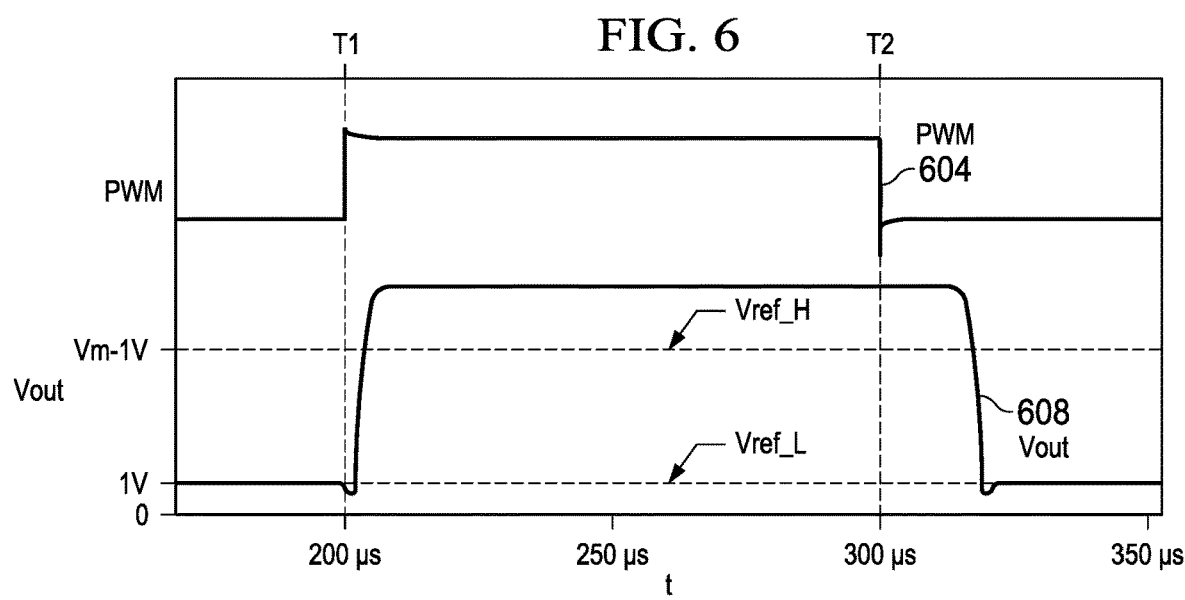
FIG. 6 are voltage versus time diagrams illustrating waveforms generated by the driver system of an example embodiment.

FIG. 6 are waveforms generated by the driver system 100 of an example embodiment. The x-axis represents time and the y-axis represents voltage. In the example of FIG. 6, the gate signal Gate_MH is applied to the high-side FET MH. At time T1, a PWM signal 604 is applied to the gate of MH, and the output voltage Vout 608 rises from approximately 0V to Vm. The slew time is the time period between when Vout rises above Vref_L to when Vout rises above Vref_H. In the example of FIG. 6, the measured slew time (rise time) is approximately 2.92 us which is near a target slew time of approximately 3 us.

At time T2, the PWM signal 604 is de-asserted, and after a delay (due to the inductive load), Vout slews downward. The measured slew time (i.e., time between Vref_H and Vref_L) is approximately 3.1 us, which is near the target slew time of approximately 3 us.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means+/−10 percent of the stated value. As used herein, the term "modulate" shall also mean "to vary" or "to change." The terms "node", "terminal", "pin" and "interconnection", for example, are interchangeably used and referred to any connection (or interconnection) between features. These terms are not meant to be limiting with respect to a certain type of physical structure. For example, the "terminals" of a circuit element are meant to be each connection to such circuit element. Hence, an integrated resistor would be referred to have two terminals (ends) even though these "terminals" are just the two connections to the integrated resistor.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A circuit comprising:
   a comparison circuit having a first input adapted to be coupled to an output voltage, a second input adapted to be coupled to an upper reference voltage, and a third input adapted to be coupled to a lower reference voltage;
   a slew time detection circuit having a first input adapted to receive a pulse width modulated (PWM) signal and a second input coupled to the comparison circuit;
   a gate current control circuit having a first input coupled to receive a target slew time, a second input coupled to the output of the slew time detection circuit and an output; and
   a gate driver having a first input adapted to receive the PWM signal and a second input coupled to the output of the gate current control circuit.

2. The circuit of claim 1, further comprising a transistor control circuit coupled to receive the PWM signal.

3. The circuit of claim 1, wherein the comparison circuit comprises:
   a first comparator having a non-inverting input coupled to the second input of the comparison circuit and an inverting input coupled to the output voltage; and
   a second comparator having a non-inverting input coupled to the output voltage and an inverting input coupled to the lower reference voltage.

4. A motor driver system comprising:
   a high-side transistor having a first terminal, a second terminal, and having a control terminal;
   a comparison circuit having a first input coupled to the second terminal of the high-side transistor, a second input coupled to an upper reference voltage, a third input coupled to a lower reference voltage and an output;
   a slew time detection circuit having a first input adapted to receive a pulse width modulated (PWM) signal and a second input coupled to the output of the comparison circuit and an output;
   a gate current control circuit having a first input coupled to receive a target slew voltage, a second input coupled to the output of the slew time detection circuit and an output; and
   a gate driver having a first input adapted to receive the PWM signal and a second input coupled to the output of the gate current control circuit, the gate driver having an output coupled to the control terminal.

5. The motor driver system of claim 4, wherein the gate current control circuit is operable to provide an increased gate current or a decreased gate current when the high-side transistor is operating in the linear region.

6. The motor driver system of claim 4, wherein the transistor transitions to the linear region when a voltage on the second terminal of the high-side transistor rises above the lower reference voltage and exits the linear region when the voltage on the second terminal of the high-side transistor rises above the upper reference voltage.

7. The motor driver system of claim 6, wherein the comparison circuit is operable to provide the start signal when the voltage on the second terminal of the high-side transistor rises above the lower reference voltage and to provide an end signal when the voltage on the second terminal of the high-side transistor rises above the upper reference voltage.

8. A motor driver system, comprising:
- a low-side transistor having a first terminal, a second terminal coupled to a ground terminal, and having a control terminal;
- a comparison circuit having a first input, a second input adapted to be coupled to an upper reference voltage, a third input adapted to be coupled to a lower reference voltage and an output;
- a slew time detection circuit having a first input adapted to receive a pulse width modulated (PWM) signal and a second input coupled to the output of the comparison circuit and an output;
- a gate current control circuit having a first input coupled to receive a target slew time and a second input coupled to the output of the slew time detection circuit and an output; and
- a gate driver having a first input coupled to receive a low-side PWM signal and a second input coupled to the output of the gate current control circuit, the gate driver having an output coupled to the control terminal.

9. The motor driver system of claim 8, wherein the gate current control circuit provides an increased gate current or a decreased gate current when the low-side transistor is operating in the linear region.

10. The motor driver system of claim 8, wherein the low-side transistor transitions to a linear region when an output voltage on the first terminal of the low-side transistor falls below the upper reference voltage and exits the linear region when the output voltage on the first terminal of the low-side transistor falls below the lower reference voltage.

11. The motor driver system of claim 8, wherein the comparison circuit provides a start signal when the voltage on the first terminal of the low-side transistor falls below the upper reference voltage and to provide an end signal when the voltage on the first terminal of the low-side transistor falls below the lower reference voltage.

12. A method of regulating a slew time of an output voltage of a motor driver system, comprising:
- receiving a target slew time;
- comparing an output voltage of the driver system with an upper reference voltage and a lower reference voltage;
- providing a start signal and an end signal based on the comparison, wherein the start signal indicating when a transistor transitions to a linear region and the end signal indicating when the transistor transitions to a non-linear region;
- determining a slew time based on a duration between assertion of the start signal and assertion of the end signal; and
- increasing a gate current responsive to the slew time being greater than the target slew time and decreasing the gate current responsive to the slew time being less than the target slew time.

13. The method of claim 12, further comprising repeating the steps of increasing or decreasing the gate current until the slew time is approximately equal to the target slew time.

14. The method of claim 12, further comprising:
- generating a gate drive signal based on the increased/decreased gate current;
- applying the gate drive signal to a gate of the transistor.

15. The method of claim 12, further comprising providing the increased/decreased gate current when the transistor is in the linear region.

16. The method of claim 12, further comprising providing the start signal when the output voltage falls below the upper reference voltage and providing the end signal when the output voltage falls below the lower reference voltage.

17. The method of claim 12, further comprising providing the start signal when the output voltage rises above the lower reference voltage and providing the end signal when the output voltage rises above the upper reference voltage.

* * * * *